(12) United States Patent
Park et al.

(10) Patent No.: US 11,817,021 B2
(45) Date of Patent: Nov. 14, 2023

(54) DISPLAY DEVICE

(71) Applicant: Samsung Display Co., LTD., Yongin-si (KR)

(72) Inventors: Dong Jin Park, Hwaseong-si (KR); Seung Jae Kang, Asan-si (KR); Sung-Jun Kim, Hwaseong-si (KR); Ha Sook Kim, Hwaseong-si (KR); Jeong Weon Seo, Hwaseong-si (KR); Min-Gwan Hyun, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/502,753

(22) Filed: Oct. 15, 2021

(65) Prior Publication Data

US 2022/0208032 A1  Jun. 30, 2022

(30) Foreign Application Priority Data

Dec. 31, 2020 (KR) .......................... 10-2020-0189661

(51) Int. Cl.
*G09F 9/302* (2006.01)
*F16M 13/02* (2006.01)
*H05K 7/14* (2006.01)

(52) U.S. Cl.
CPC ........... *G09F 9/3023* (2013.01); *F16M 13/02* (2013.01); *H05K 7/1401* (2013.01)

(58) Field of Classification Search
CPC ........ G09F 9/3023; G09F 9/00; G06F 3/1446; G02F 1/133308; H05K 7/1401; F16M 13/02; F16M 11/045; F16M 11/18; F16M 11/046
See application file for complete search history.

(56) References Cited

U.S. PATENT DOCUMENTS

| 2013/0010477 | A1* | 1/2013 | Wu ...................... F21V 17/105 |
| | | | 362/351 |
| 2018/0067590 | A1* | 3/2018 | Wang ...................... G06F 3/046 |
| 2019/0191574 | A1* | 6/2019 | Kim ...................... H05K 5/0017 |
| 2020/0104090 | A1* | 4/2020 | Kim ...................... G06F 3/1446 |
| 2020/0194539 | A1* | 6/2020 | Kim ...................... H01L 51/5237 |
| 2020/0196462 | A1* | 6/2020 | Kim ...................... H05K 5/0021 |

FOREIGN PATENT DOCUMENTS

| KR | 10-2019-0057723 | 5/2019 |
| KR | 10-2019-0078995 | 7/2019 |
| KR | 10-2051604 | 12/2019 |
| KR | 10-2020-0036408 | 4/2020 |
| KR | 10-2020-0072789 | 6/2020 |

* cited by examiner

*Primary Examiner* — Muhammad N Edun

(74) *Attorney, Agent, or Firm* — KILE PARK REED & HOUTTEMAN PLLC

(57) ABSTRACT

A display device includes display panels; a frame supporting the display panels; a first magnetic body disposed on the frame; and a second magnetic body disposed on at least a part of the display panels, wherein the first magnetic body and the second magnetic body overlap each other in a direction parallel to a surface of the display panels and a direction perpendicular to the surface of the display panels.

18 Claims, 12 Drawing Sheets

DISPLAY DEVICE

CROSS-REFERENCE TO RELATED APPLICATION(S)

This application claims priority to and benefits of Korean Patent Application No. 10-2020-0189661 under 35 U.S.C. § 119 filed on Dec. 31, 2020 in the Korean Intellectual Property Office, the entire contents of which are incorporated herein by reference.

BACKGROUND

1. Technical Field

The disclosure relates to a display device.

2. Description of the Related Art

Display devices include a liquid crystal display (LCD), a plasma display panel (PDP), an organic light emitting diode (OLED) device, a field effect display (FED), an electrophoretic display device, and the like.

As the display devices are developed, demand for a flat panel display device having an ultra-large screen is increasing. However, a volume of the flat panel display device having the ultra-large screen increases or image quality thereof deteriorates.

In order to implement an ultra-large flat panel display device of which volume is not unnecessarily increased or of which image quality does not deteriorate, a tiled display device has been proposed in which flat display panels are connected in a tiled form to implement one large screen.

In the tiled-type display device to which flat display panels are connected, in case that a separation distance between adjacent display panels is widened or is not constant, an area in which an image is not displayed may be viewed, thus display quality may be deteriorated.

The above information disclosed in this background section is only for enhancement of understanding of the background of the described technology, and therefore it may contain information that does not form the prior art that may already be known to a person of ordinary skill in the art.

SUMMARY

Embodiments provide a display device that may prevent display quality from deteriorating by maintaining a constant interval between adjacent display panels in a large area display device including flat display panels.

Objects of the embodiments are not limited to the above-described objects, and may be variously extended without departing from the spirit and scope of the embodiments.

An embodiment provides a display device that may include display panels; a frame supporting the display panels; a first magnetic body disposed on the frame; and a second magnetic body disposed on at least a part of the display panels, wherein the first magnetic body and the second magnetic body may overlap each other in a direction parallel to a surface of the display panels and a direction perpendicular to the surface of the display panels.

The first magnetic body and the second magnetic body may have different polarities, and the first magnetic body may include a first portion extending from the frame in a direction perpendicular to a direction in which the frame extends; and a second portion extending from the first portion in a direction parallel to a direction perpendicular to the surface of the display panels.

The first magnetic body and the second magnetic body may overlap each other in a direction parallel to the first portion of the first magnetic body.

The display device may further include a first adhesive layer disposed between the frame and the first magnetic body.

The frame may include first frames extending in a first direction and second frames extending in a second direction perpendicular to the first direction; and at least a part of the first frames and the second frames may include a first portion extending from the first frames and the second frames in the first direction or the second direction; and a second portion extending from the first portion in a third direction perpendicular to the first direction and the second direction; and the first magnetic body may be disposed on the first portion and the second portion.

The display panels may include a first surface displaying an image; and a second surface opposite to the first surface, and the second magnetic body may be disposed on the second surface.

The display device may further include a second adhesive layer disposed between the second surface and the second magnetic body.

The display panels may include a first surface displaying an image; and a second surface opposite to the first surface, and the second magnetic body may be disposed on the second surface.

The display device may further comprise a second adhesive layer disposed between the second surface and the second magnetic body.

The frame may include first frames extending in a first direction and second frames extending in a second direction perpendicular to the first direction; the first frames and the second frames may include at least one overlapping portion overlapping each other in a third direction perpendicular to the first direction and the second direction; and the first frames and the second frames may be connected to each other by a coupling member disposed at the at least one overlapping portion.

The display device may further include side frames connected to frames among the first frames and frames among the second frames that are disposed along an edge of the display device.

The display device may further include a frame connector connecting the first frames and the second frames, and the side frames.

An embodiment provides a display device that may include display panels disposed in a first direction and a second direction perpendicular to the first direction; a frame supporting the display panels; a first magnetic body disposed on the frame; and a second magnetic body disposed on at least a part of the display panels, wherein display panels adjacent to each other among the display panels may be disposed with a first interval; the first magnetic body and the second magnetic body may overlap each other in a direction perpendicular to a direction in which the frame extends and a direction perpendicular to a surface of the display panels; and the first magnetic body may contact the second magnetic body.

The display panels may display an image; the first magnetic body and the second magnetic body may be spaced apart from each other; and display panels among the display panels that are adjacent to each other may be disposed with a second interval.

The first interval may be greater than the second interval.

The first magnetic body may include a first portion extending from the frame in the direction perpendicular to a direction in which the frame extends, and a second portion extending from the first portion in a direction parallel to the direction perpendicular to the surface of the display panels.

The frame may include first frames extending in the first direction; and second frames extending in the second direction perpendicular to the first direction; at least a part of the first frames and the second frames may include a first portion extending from the first frames and the second frames in the first direction or the second direction; and a second portion extending from the first portion to extend in a third direction perpendicular to the first direction and the second direction; and the first magnetic body may be disposed on the first portion and the second portion.

The display panels may include a first surface displaying an image; and a second surface opposite direction to the first surface, and the second magnetic body may be disposed on the second surface.

The display device may further include a first adhesive layer disposed between the frame and the first magnetic body; and a second adhesive layer disposed between the second surface and the second magnetic body.

The frame may include first frames extending in the first direction; and second frames extending in the second direction perpendicular to the first direction; the first frames and the second frames may include at least one overlapping portion overlapping each other in the third direction that is perpendicular to the first direction and the second direction; and the first frames and the second frames may be connected to each other by a coupling member disposed at the at least one overlapping portion.

According to a display device, it is possible to prevent display quality from deteriorating by maintaining a constant interval between adjacent display panels in a large area display device including flat display panels.

Effects of the embodiments are not limited to the above-described effects, and may be variously extended without departing from the spirit and scope of the embodiments.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
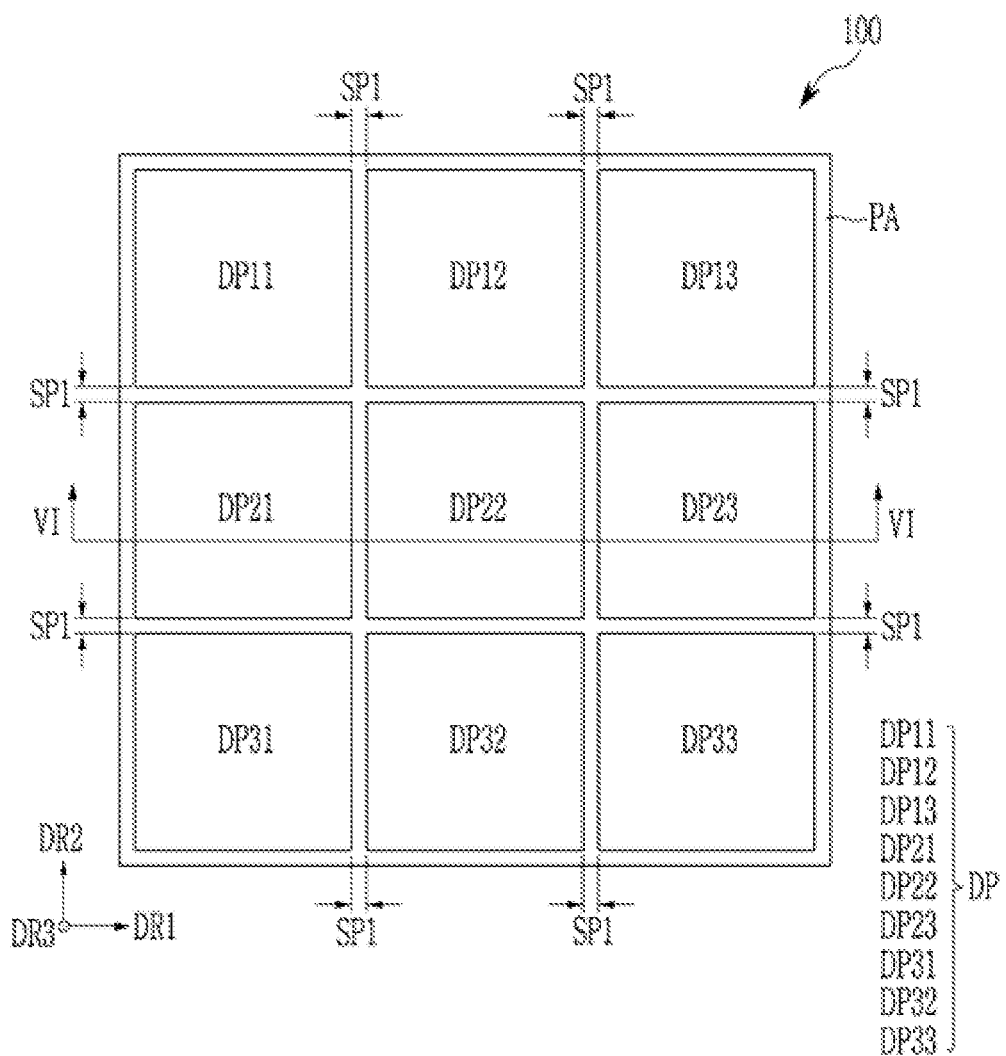
FIG. 1 illustrates a schematic top plan view of a display device according to an embodiment.

The disclosure will be described more fully hereinafter with reference to the accompanying drawings, in which embodiments are shown. As those skilled in the art would appreciate, the described embodiments may be modified in various different ways, all without departing from the spirit or scope of the disclosure.

In order to clearly describe the embodiments, parts that may be irrelevant to the description may be omitted, and identical or similar constituent elements throughout the specification are denoted by the same reference numerals.

Further, in the drawings, the size and thickness of each element are arbitrarily illustrated for ease of description, and the disclosure is not necessarily limited to those illustrated in the drawings. In the drawings, the thicknesses of layers, films, panels, regions, areas etc., are exaggerated for clarity. In the drawings, for ease of description, the thicknesses of some layers and areas are exaggerated.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, area or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In addition, unless explicitly described to the contrary, the word "comprise" and variations such as "comprises" or "comprising" "includes," and/or "including,", "has," "have," and/or "having," and variations thereof will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Furthermore, throughout the specification, "connected" does not only mean when two or more elements are directly connected, but also when two or more elements are indirectly connected through other elements, and when they are physically connected or electrically connected, and further, it may be referred to by different names depending on a position or function, and may also be referred to as a case in which respective parts that may be substantially integrated may be linked to each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
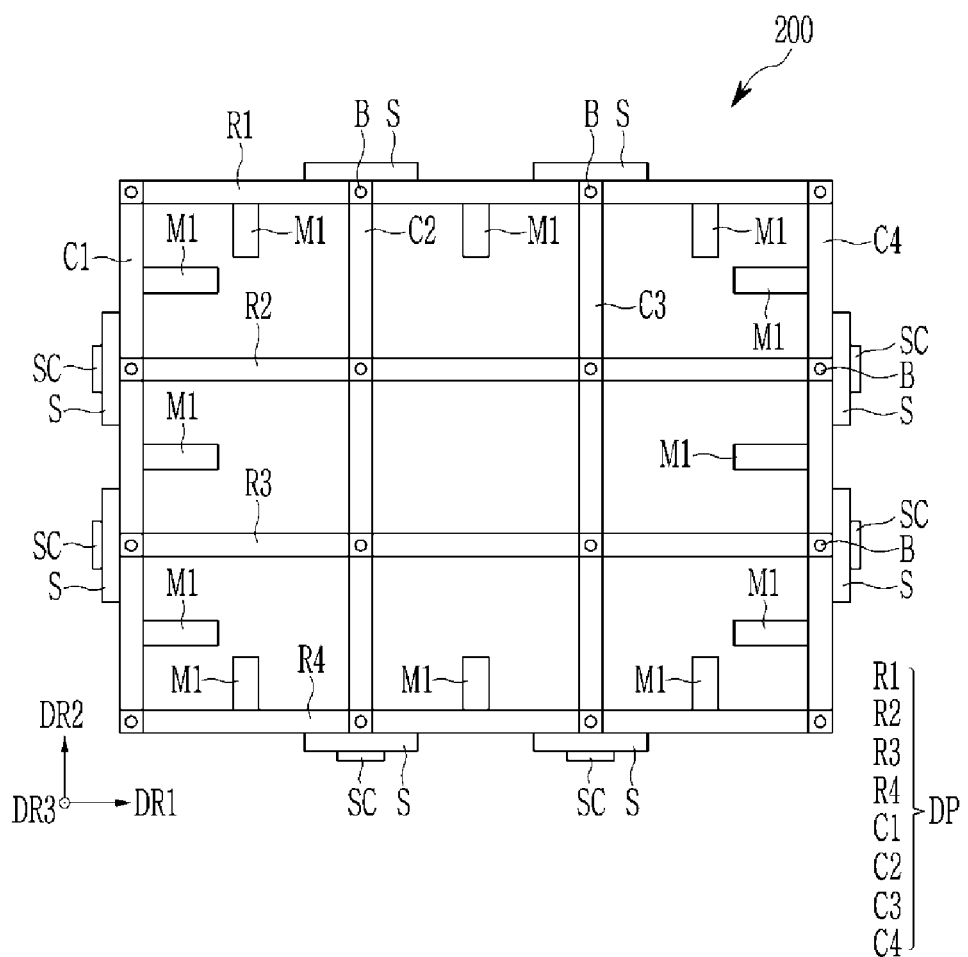
FIG. 2 illustrates a schematic top plan view of a portion of a frame of a display device according to an embodiment.
Figure 3A:
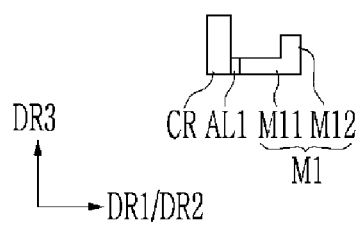
FIG. 3A and FIG. 3B illustrate schematic cross-sectional views of a portion of a display device according to an embodiment.
Figure 3B:
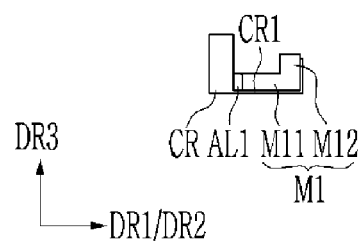
Figure 4:
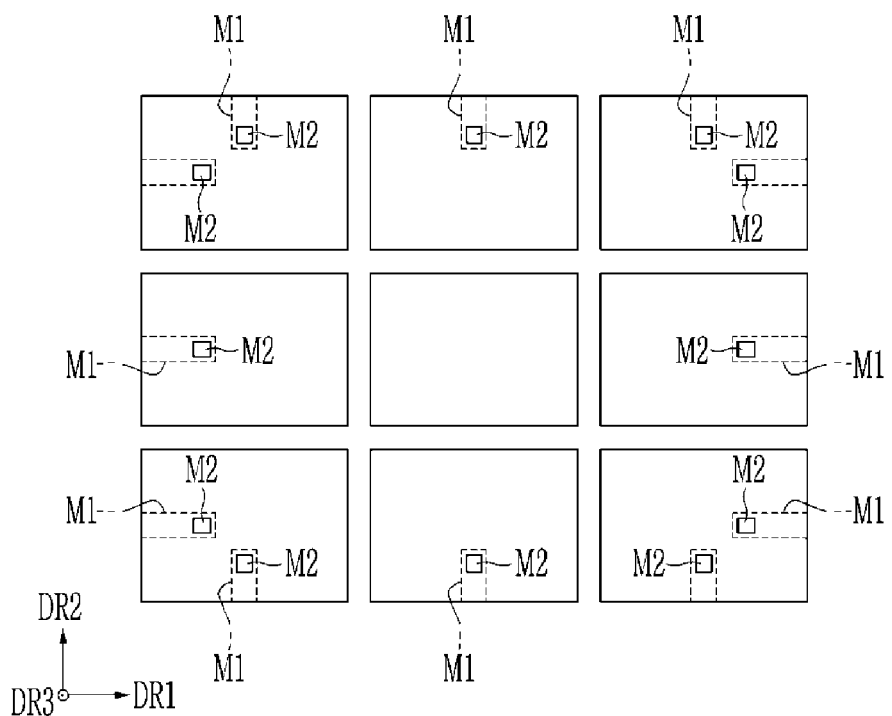
FIG. 4 illustrates a schematic top plan view of a portion of a display device according to an embodiment.
Figure 5:
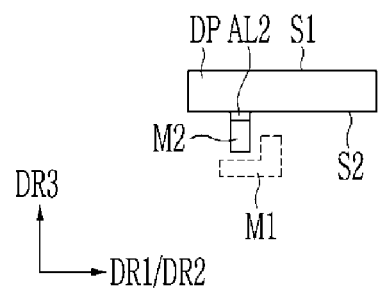
FIG. 5 illustrates a schematic cross-sectional view of a portion of a display device according to an embodiment.
Figure 6:
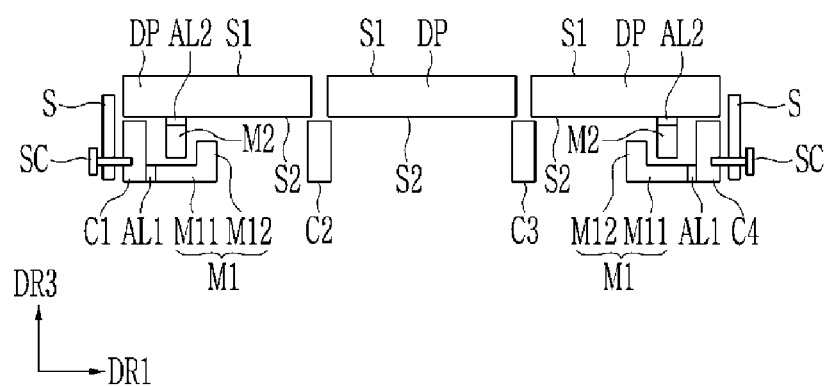
FIG. 6 illustrates a schematic cross-sectional view taken along line VI-VI of FIG. 1.

A display device according to an embodiment will be described with reference to FIG. 1 to FIG. 4. FIG. 1 illustrates a schematic top plan view of a display device according to an embodiment, FIG. 2 illustrates a schematic top plan view of a portion of a frame of a display device according to an embodiment, and FIG. 3A and FIG. 3B illustrate schematic cross-sectional views of a portion of a display device according to an embodiment. FIG. 4 illustrates a schematic top plan view of a portion of a display device according to an embodiment, and FIG. 5 illustrates a schematic cross-sectional view of a portion of a display device according to an embodiment. FIG. 6 illustrates a schematic cross-sectional view taken along line VI-VI of FIG. 1.

Referring to FIG. 1, a display device 100 according to an embodiment may include a display panel DP including display panels DP11, DP12, DP13, DP21, DP22, DP23, DP31, DP32, and DP33 and a peripheral area PA positioned or disposed around or adjacent to the display panel DP.

The display panels DP11, DP12, DP13, DP21, DP22, DP23, DP31, DP32, and DP33 may be disposed in a matrix form along a first direction DR1 and a second direction DR2 perpendicular to the first direction DR1. For example, a first display panel DP11, a second display panel DP12, and a third display panel DP13 are disposed in a line along the first direction DR1; a fourth display panel DP21, a fifth display panel DP22, and a sixth display panel DP23 are disposed in a line along the first direction DR1; and a seventh display panel DP31, an eighth display panel DP32, and a ninth display panel DP33 are disposed in a line along the first direction DR1. The first display panel DP11, the fourth display panel DP21, and the seventh display panel DP31 are disposed in a line along the second direction DR2; the second display panel DP12, the fifth display panel DP22, and the eighth display panel DP32 are disposed in a line along the second direction DR2; and the third display panel DP13, the sixth display panel DP23, and the ninth display panel DP33 are disposed in a line along the second direction DR2.

The display panels DP11, DP12, DP13, DP21, DP22, DP23, DP31, DP32, and DP33 may form a first interval SP1. The display panels DP11, DP12, DP13, DP21, DP22, DP23, DP31, DP32, and DP33 may be extended so that a flat area thereof is increased by a driving column in case that being driven, and thus in order to prevent adjacent display panels DP from colliding and being damaged due to expansion thereof, they may be disposed to be at least provided with the first interval SP1 therebetween.

In the illustrated embodiment, the first interval SP1 between the adjacent display panels is shown to be relatively wide for explanation, and the first interval SP1 may be a very small interval compared with a size of the display panels.

In the illustrated embodiment, three display panels are disposed in a line along the first direction DR1 and three display panels are disposed in a line along the second direction DR2, but this is an example, and the embodiment is not limited thereto, and display panels may be disposed in a line along the first direction DR1 and the second direction DR2.

A frame 200 supporting the display panel DP will be described with reference to FIG. 6 along with FIG. 2.

Referring to FIG. 6 along with FIG. 2, the frame 200 supporting the display panel DP may include rear frames CR including first rear frames R1, R2, R3, and R4 and second rear frames C1, C2, C3, and C4, first magnetic bodies M1, side frames S, and frame connectors SC.

The first rear frames R1, R2, R3, and R4 include a first frame R1, a second frame R2, a third frame R3, and a fourth frame R4 that extend along the first direction DR1, and the second rear frames (C1, C2, C3, and C4) include a fifth frame C1, a sixth frame C2, a seventh frame C3, and an eighth frame C4 that extend along the second direction DR2, while the first rear frames R1, R2, R3, and R4 and the second rear frames C1, C2, C3, and C4 may overlap each other along a third direction DR3.

A coupling member B is disposed at the overlapping portion of the first rear frames R1, R2, R3, and R4 and the second rear frames C1, C2, C3, and C4, and the first rear frames R1, R2, R3, and R4 extending in the first direction DR1 and the second rear frames C1, C2, C3, and C4 extending in the second direction DR2 may be connected or coupled with each other by the coupling member B.

Among the first rear frames R1, R2, R3, and R4 and the second rear frames C1, C2, C3, and C4, first magnetic bodies M1 are attached to or disposed on the first frame R1, the fourth frame R4, the fifth frame C1, and the eighth frame C4 that are disposed at an edge. The first magnetic bodies M1 include a first portion M11 extending in a direction perpendicular to the direction in which the first frame R1, the fourth frame R4, the fifth frame C1, and the eighth frame C4 extend, for example, a direction parallel to the first direction DR1 or the second direction DR2, and a second portion M12 extending in a direction parallel to the third direction DR3 from the first portion M11.

In the illustrated embodiment, among the first rear frames R1, R2, R3, and R4 and the second rear frames C1, C2, C3, and C4, it is shown that the first magnetic bodies M1 are attached to or disposed on the first frame R1, the fourth frame R4, the fifth frame C1, and the eighth frame C4 that are disposed at the edge, but the embodiment is limited thereto, and the first magnetic bodies M1 may be attached to or disposed on at least some or a part of the first rear frames R1, R2, R3, and R4 and the second rear frames C1, C2, C3, and C4.

Among the first rear frames R1, R2, R3, and R4 and the second rear frames C1, C2, C3, and C4, the first magnetic bodies M1 are attached to or disposed on outer side surfaces of the first frame R1, the fourth frame R4, the fifth frame C1, and the eighth frame C4 that are disposed at an edge. The side frames S are connected to the rear frames (R1, R4, C1, and C4) through the frame connectors SC.

The frame connectors SC may include at least one of connecting members such as bolts or screws.

The first rear frames R1, R2, R3, and R4 and the second rear frames C1, C2, C3, and C4, and the side frames S, support the display panels DP11, DP12, DP13, DP21, DP22, DP23, DP31, DP32, and DP33.

Hereinafter, a combination of the rear frames CR and the first magnetic bodies M1 will be described with reference to FIG. 3A and FIG. 3B.

Referring to FIG. 3A, a first adhesive layer AL1 may be disposed between the rear frame CR and the first magnetic body M1 of the display device according to the embodiment, and the rear frame CR and the first magnetic body M1 may be connected or coupled to each other by the first adhesive layer AL1.

The first magnetic body M1 may include the first portion M11 extending in a direction perpendicular to the direction in which the frame CR attached to or disposed on the first magnetic body M1 extends, for example, a direction parallel to the first direction DR1 or the second direction DR2, and the second portion M12 extending along a direction parallel to the third direction DR3 from the first portion M11.

The first adhesive layer AL1 may be disposed between the rear frame CR and the first portion M11 of the first magnetic body M1.

Referring to FIG. 3B, unlike the display device according to the embodiment shown in FIG. 3A, the rear frame CR further may include an extension CR1. An extension CR2 of the rear frame CR may include a portion that is extended in a direction perpendicular to the direction in which the frame CR extends, for example, the first direction DR1 or the second direction DR2, and is bent in the third direction DR3, and the first magnetic body M1 is disposed on the extension CR2 of the rear frame CR. The first magnetic body M1 may be attached to or disposed on the extension CR2 of the rear frame CR.

The extension CR2 of the rear frame CR may be disposed to surround the first portion M11 and the second portion M12 of the first magnetic body M1.

As such, by further including the extension CR2 of the rear frame CR surrounding the first magnetic body M1, the first magnetic body M1 and the rear frame CR may be stably connected.

Rear surfaces of the display panels DP11, DP12, DP13, DP21, DP22, DP23, DP31, DP32, and DP33 will now be described with reference to FIG. 4 to FIG. 6.

Referring to FIG. 4 to FIG. 6, second magnetic bodies M2 are attached to or disposed on the rear surface of the display panel DP including the display panels DP11, DP12, DP13, DP21, DP22, DP23, DP31, DP32, and DP33. The second magnetic bodies M2 may be disposed to overlap the first magnetic bodies M1 along a direction parallel to the direction in which the first portion M11 of the first magnetic body M1 extends, for example, along the first direction DR1 or the second direction DR2 and the third direction DR3.

Referring to FIG. 5, a display panel DP of a display device according to an embodiment may include a first surface S1 displaying an image and a second surface S2 disposed in a direction opposite to the first surface S1. A second adhesive layer AL2 may be disposed between the second surface S2 of the display panel DP and the second magnetic body M2, and the second surface S2 of the display panel DP and the second magnetic body M2 may be connected or coupled to each other by the second adhesive layer AL2.

As described above, the second magnetic body M2 may overlap the first magnetic body M1.

By way of example, referring to FIG. 5 together with FIG. 3A and FIG. 3B, the second magnetic body M2 may overlap the first portion M11 of the first magnetic body M1 along the third direction DR3, and at the same time, the second magnetic body M2 may overlap the second portion M12 of the first magnetic body M1 along the first direction DR1 or the second direction DR2. For example, the first portion M11 of the first magnetic body M1 and the second portion M12 of the first magnetic body M1 may be disposed to surround a lower surface and side surfaces of the second magnetic body M2.

The first magnetic body M1 and the second magnetic body M2 may have different polarities, and accordingly, attractive force may act therebetween.

Figure 7:
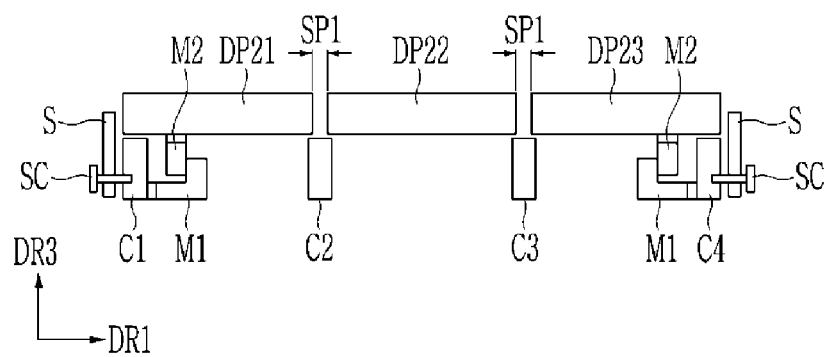
FIG. 7 illustrates a schematic cross-sectional view of a first state of a display device according to an embodiment.
Figure 8:
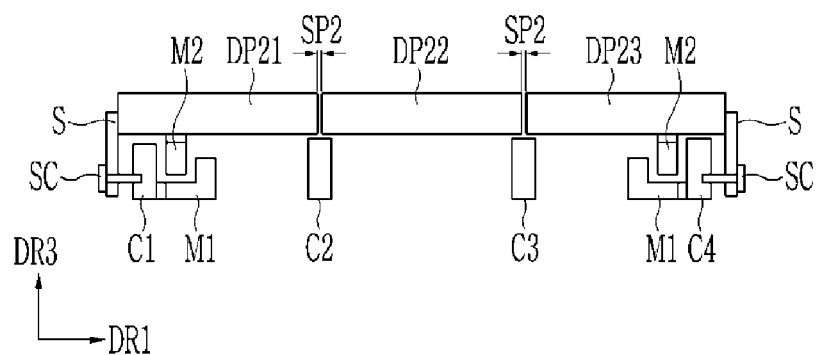
FIG. 8 illustrates a schematic cross-sectional view of a second state of a display device according to an embodiment.
Figure 9:
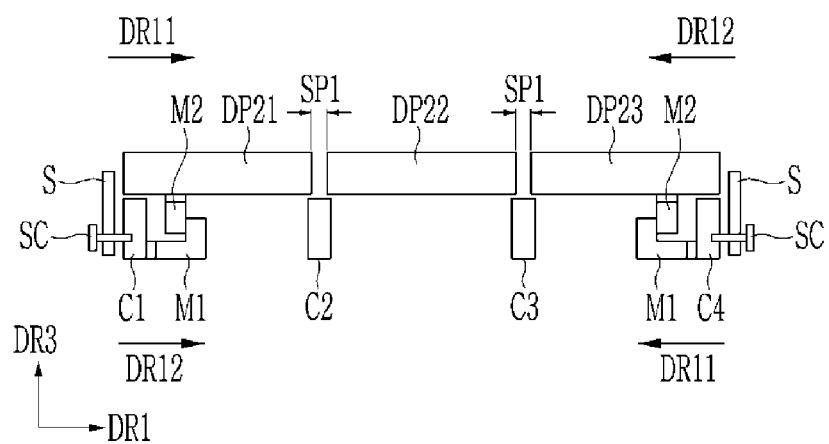
FIG. 9 illustrates a schematic cross-sectional view of a third state of a display device according to an embodiment.

Hereinafter, an interval change between the display panels of the display device according to the embodiment will be described with reference to FIG. 7 to FIG. 9. FIG. 7 illustrates a schematic cross-sectional view of a first state of a display device according to an embodiment, FIG. 8 illustrates a schematic cross-sectional view of a second state of a display device according to an embodiment, and FIG. 9 illustrates a schematic cross-sectional view of a third state of a display device according to an embodiment. FIG. 7, FIG. 8, and FIG. 9 illustrate schematic cross-sectional views taken along line VI-VI of FIG. 1.

A first state in which an image is not displayed will be described with reference to FIG. 7. The display panels DP21, DP22, and DP23 disposed to be adjacent to each other in the first state may be supported by the rear frames C1, C2, C3, and C4 and the side frame S, and may be disposed to form the first interval SP1. The first magnetic body M1 attached to or disposed on at least some or a part C1 and C4 of the rear frames C1, C2, C3, and C4 and the second magnetic body M2 attached to or disposed on the second surface S2 of at least some or a part (DP21 and DP23) of the display panels DP21, DP22, and DP23 may be in a state of being connected or coupled to each other by attractive force.

A second state in which an image is displayed will be described with reference to FIG. 8. In the second state, heat may be generated from the display panels DP21, DP22, and DP23 due to driving for displaying, and by this heat, flat areas of the display panels DP21, DP22, and DP23 may be extended to be widened. For example, in case that heat of about 50° C. is generated in case that the display panel DP is driven, the display panel DP having a plane length of about 65 inches may extend about 0.1 mm in a plan view.

As such, the display panels DP21, DP22, and DP23 disposed to be adjacent to each other while being extended by the heat may be disposed to form a second interval SP2 with each other, and the second interval SP2 between the display panels DP21, DP22, and DP23 disposed to be adjacent to each other in the second state may be narrower than the first interval SP1 between the display panels DP21, DP22, and DP23 disposed to be adjacent to each other in the first state.

A third state in which an image is not displayed will be described with reference to FIG. 9. The display panels DP21, DP22, and DP23 extended by the heat in the second state are reduced back to their original state as they cool down in the state in which an image is not displayed.

By the attractive force between the first magnetic body M1 attached to or disposed on at least some or a part C1 and C4 of the rear frames C1, C2, C3, and C4 and the second magnetic body M2 attached to or disposed on the second surface S2 of at least some or a part DP21 and DP23 of the display panels DP21, DP22, and DP23, the fourth display panel DP21 and the sixth display panel DP23 disposed at the edge of the display device are directed to the fifth display panel DP22 to move in the fourth direction DR11 and the fifth direction DR12 that are oriented to the center of the display device, so that the display panels DP21, DP22, and DP23 may be restored to form the first interval SP1 as in the first state.

In case that the fourth display panel DP21 and the sixth display panel DP23 move in a sixth direction DR13 and a seventh direction DR14 that are directions opposite to the fourth direction DR11 and the fifth direction DR12, an interval between the display panels DP may be wider than the first interval SP1.

According to the display device of the embodiment, in case that the first magnetic body M1 attached to or disposed on the rear frame CR supporting the display panels DP and the second magnetic body M2 attached to or disposed on the second surface S2 of the display panels DP are included, and in case that the display panels DP are again reduced to their original size after being extended by the driving heat, the interval may be restored to the original interval by the attractive force between the first magnetic body M1 and the second magnetic body M2, so that by preventing the interval between the display panels DP from increasing or becoming irregular, it is possible to prevent display quality from being deteriorated due to an increase or irregularity of the interval between the display panels DP.

Figure 10:
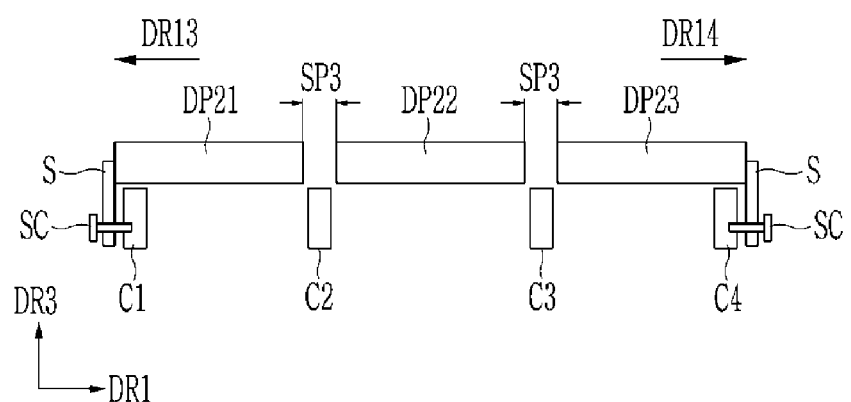
FIG. 10 illustrates a schematic cross-sectional view of a related art display device.

Hereinafter, an interval between panels DP of the display device will be described with reference to FIG. 10 and FIG. 11 along with FIG. 7 to FIG. 9. FIG. 10 illustrates a schematic cross-sectional view of a related art display device, and FIG. 11 illustrates a schematic top plan view of a related art display device.

In case that the display panels DP21, DP22, and DP23 extended by heat are reduced to their original state as the display panels DP21, DP22, and DP23 are cooled in the state in which no image is displayed, and in case that the first magnetic body M1 attached to or disposed on the rear frame CR supporting the display panels DP and t second magnetic body M2 attached to or disposed on the second surface S2 of the display panels DP are not included as in a related art display device, as shown in FIG. 10, the fourth and sixth display panels DP21 and DP23 may move in a sixth direction DR13 and a seventh direction DR14 that are directions opposite to the fourth direction DR11 and the fifth direction DR12, thus the display panels DP adjacent to each other may be disposed to form a third interval SP3, and the third interval SP3 may be wider than the first interval SP1.

Figure 11:
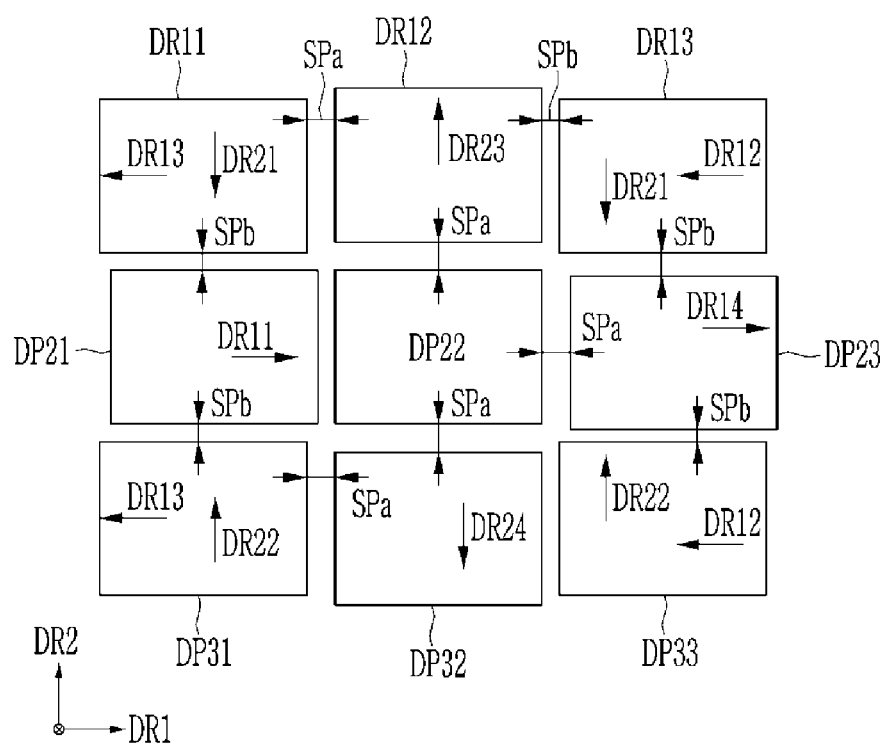
FIG. 11 illustrates a schematic top plan view of a related art display device.

Referring to FIG. 11, in case that the display panels DP11, DP12, DP13, DP21, DP22, DP23, DP31, DP32, and DP33 are reduced to their original state as they are cooled in the state in which no image is displayed, they may move in the fourth direction DR11 and the fifth direction DR12 toward the center of the display device along the first direction DR1, and may move in the sixth direction DR13 and the seventh direction DR14 that are directions opposite to the fourth direction DR11 and the fifth direction DR12. Similarly, the display panels may move to the eighth direction DR21 and the ninth direction DR22 toward the center of the display device along the second direction DR2, or may move in the tenth direction DR23 and the eleventh direction DR24 that are directions opposite to the eighth direction DR21 and the ninth direction DR22.

Therefore, depending on the direction in which the display panels DP11, DP12, DP13, DP21, DP22, DP23, DP31, DP32, and DP33 are reduced, the interval between the adjacent display panels may form a relatively wide interval SPa, or may form a relatively narrow interval SPb. As described above, since the interval between the adjacent display panels is irregularly formed as the wide interval SPa or the narrow interval SPb according to the position, the intervals of the display panels may be irregularly disposed.

As shown in FIG. 10 and FIG. 11, in the related art display device, in case that the display panels extended by heat are reduced to their original state as they are cooled in the state in which no imaged is displayed, the interval between the adjacent display panels may increase, or the interval between the adjacent display panels may be varied depending on their positions, thus the display quality of the display device may be deteriorated.

However, according to the display device of the embodiment, in case that the first magnetic body M1 attached to or disposed on the rear frame CR supporting the display panels DP and the second magnetic body M2 attached to or disposed on the second surface S2 of the display panels DP are included, and in case that the display panels DP are again reduced to their original size after being extended by the driving heat, the interval may be restored to the original interval by the attractive force between the first magnetic body M1 and the second magnetic body M2, so that, by preventing the interval between the display panels DP from increasing or becoming irregular, it is possible to prevent display quality from being deteriorated due to an increase or irregularity of the interval between the display panels DP.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:
1. A display device comprising:
   a plurality of display panels;
   a frame supporting the plurality of display panels;
   a first magnetic body disposed on the frame; and
   a second magnetic body disposed on at least one of the plurality of display panels, wherein the first magnetic body and the second magnetic body overlap each other in a direction parallel to a surface of the plurality of display panels and a direction perpendicular to the surface of the plurality of display panels wherein the first magnetic body and the second magnetic body have different polarities, and the first magnetic body includes;

a first portion extending from the frame a direction perpendicular to a direction in which the frame extends: and a second portion extending from the first portion in a direction parallel to a direction perpendicular to the surface of the plurality of display panels.

2. The display device of claim 1, wherein the first magnetic body and the second magnetic body overlap each other in a direction parallel to the first portion of the first magnetic body.

3. The display device of claim 2, wherein the frame includes:

first frames extending in a first direction; and second frames extending in a second direction perpendicular to the first direction, at least a part of the first frames and the second frames includes:

a first portion extending from the first frames and the second frames in the first direction or the second direction; and a second portion extending from the first portion in a third direction perpendicular to the first direction and the second direction, and the first magnetic body is disposed on the first portion and the second portion.

4. The display device of claim 1, further comprising:

a first adhesive layer disposed between the frame and the first magnetic body.

5. The display device of claim 4, wherein the plurality of display panels include:

a first surface displaying an image; and a second surface opposite to the first surface, and the second magnetic body is disposed on the second surface.

6. The display device of claim 5, further comprising:

a second adhesive layer disposed between the second surface and the second magnetic body.

7. The display device of claim 1, wherein the plurality of display panels include:

a first surface displaying an image; and a second surface opposite to the first surface, and the second magnetic body is disposed on the second surface.

8. The display device of claim 7, further comprising:

a second adhesive layer disposed between the second surface and the second magnetic body.

9. The display device of claim 1, wherein the frame includes first frames extending in a first direction and second frames extending in a second direction perpendicular to the first direction, the first frames and the second frames include at least one overlapping portion overlapping each other in a third direction perpendicular to the first direction and the second direction, and the first frames and the second frames are connected to each other by a coupling member disposed at the at least one overlapping portion.

10. The display device of claim 9, further comprising:

side frames connected to frames among the first frames and frames among the second frames that are disposed along an edge of the display device.

11. The display device of claim 10, further comprising:

a frame connector connecting the first frames and the second frames to the side frames.

12. A display device comprising:

a plurality of display panels disposed in a first direction and a second direction perpendicular to the first direction;

a frame supporting the plurality of display panels;

a first magnetic body disposed on the frame; and a second magnetic body disposed on at least one of the plurality of display panels, wherein display panels adjacent to each other among the plurality of display panels are disposed with a first interval, the first magnetic body and the second magnetic body overlap each other in a direction perpendicular to a direction in which the frame extends and a direction perpendicular to a surface of the plurality of display panels, the first magnetic body contacts the second magnetic body, the first magnetic body include a first portion extending from the frame in the direction perpendicular to a direction in which the frame extends; and a second portion extending from the first portion in a direction parallel to the direction perpendicular to the surface of the plurality of display panels.

13. The display device of claim 12, wherein display panels among the plurality of display panels that are adjacent to each other are disposed with a second interval.

14. The display device of claim 13, wherein the first interval is greater than the second interval.

15. The display device of claim 12 wherein the frame includes:

first frames extending in the first direction; and second frames extending in the second direction perpendicular to the first direction, at least a part of the first frames and the second frames include:

a first portion extending from the first frames and the second frames in the first direction or the second direction; and a second portion extending from the first portion to extend in a third direction perpendicular to the first direction and the second direction, and the first magnetic body is disposed on the first portion and the second portion.

16. The display device of claim 15, wherein the plurality of display panels include:

a first surface displaying an image; and a second surface opposite to the first surface, and the second magnetic body is disposed on the second surface.

17. The display device of claim 16, further comprising:

a first adhesive layer disposed between the frame and the first magnetic body; and a second adhesive layer disposed between the second surface and the second magnetic body.

18. The display device of claim 17, wherein the frame includes:

first frames extending in the first direction; and second frames extending in the second direction perpendicular to the first direction, the first frames and the second frames include at least one overlapping portion overlapping each other in the third direction that is perpendicular to the first direction and the second direction, and the first frames and the second frames are connected to each other by a coupling member disposed at the at least one overlapping portion.

\* \* \* \* \*